(12) United States Patent
Choi

(10) Patent No.: US 9,106,195 B2
(45) Date of Patent: Aug. 11, 2015

(54) METHOD AND APPARATUS FOR CONTROLLING SIGNAL GAIN IN DIGITAL SIGNAL PROCESSING SYSTEM

(71) Applicant: Samsung Electronics Co., Ltd, Gyeonggi-do (KR)

(72) Inventor: Kyung-Kook Choi, Seoul (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 0 days.

(21) Appl. No.: 13/873,130

(22) Filed: Apr. 29, 2013

(65) Prior Publication Data
US 2013/0287079 A1    Oct. 31, 2013

(30) Foreign Application Priority Data
Apr. 27, 2012  (KR) .................. 10-2012-0044582

(51) Int. Cl.
*H03G 3/20* (2006.01)
*H03G 3/30* (2006.01)

(52) U.S. Cl.
CPC ............... *H03G 3/20* (2013.01); *H03G 3/3042* (2013.01); *H03G 3/3078* (2013.01)

(58) Field of Classification Search
CPC ....... H03G 3/20; H03G 9/005; H03G 1/0005; H03G 3/00; H03G 9/14; H03G 3/3089; H03G 3/002; H03G 3/3042; H03G 2201/706; H03G 2201/302; H03G 2201/307

USPC .......................................................... 455/69
See application file for complete search history.

(56) References Cited

U.S. PATENT DOCUMENTS

| | | | | |
|---|---|---|---|---|
| 4,953,012 A * | 8/1990 | Abe | ............................ | 358/540 |
| 5,081,645 A * | 1/1992 | Resnikoff et al. | ............. | 375/146 |
| 5,117,384 A * | 5/1992 | Drehmel et al. | ............. | 708/505 |
| 6,052,371 A * | 4/2000 | Lemieux | ........................ | 370/338 |
| 2001/0043118 A1* | 11/2001 | Suzuki et al. | ................. | 330/151 |
| 2003/0006976 A1* | 1/2003 | Sagano et al. | ................. | 345/204 |
| 2003/0036374 A1* | 2/2003 | English et al. | ................ | 455/403 |
| 2004/0052507 A1* | 3/2004 | Kondo et al. | .................. | 386/111 |
| 2005/0047239 A1* | 3/2005 | Takahashi et al. | ............. | 365/222 |
| 2006/0165011 A1* | 7/2006 | Starr et al. | ..................... | 370/252 |
| 2010/0067587 A1* | 3/2010 | Tyree et al. | .................... | 375/259 |

FOREIGN PATENT DOCUMENTS

KR   10-2005-0062866    6/2005
KR   10-2011-0039389    4/2011

* cited by examiner

*Primary Examiner* — Chieh M Fan
*Assistant Examiner* — Sarah Hassan

(57) ABSTRACT

A method and an apparatus control a signal gain in a digital signal process system are provided. In the method, a peak power of an input signal for each of a plurality of periods is measured. The peak power for each period is compared with a threshold power. A magnitude of a signal of a period where the peak power is greater than the threshold power is controlled.

20 Claims, 10 Drawing Sheets

METHOD AND APPARATUS FOR CONTROLLING SIGNAL GAIN IN DIGITAL SIGNAL PROCESSING SYSTEM

CROSS-REFERENCE TO RELATED APPLICATION(S) AND CLAIM OF PRIORITY

The present application is related to and claims the benefit under 35 U.S.C. §119(a) of a Korean patent application filed in the Korean Intellectual Property Office on Apr. 27, 2012 and assigned Ser. No. 10-2012-0044582, the entire disclosure of which is hereby incorporated by reference.

TECHNICAL FIELD

The present disclosure relates to a digital signal process system. More particularly, the present disclosure relates to a method and an apparatus for controlling a signal gain in an electronic device.

BACKGROUND

A digital signal process system in a mobile communication base station processes a signal to be input to a modem by including a Digital Down Converter (DDC) for converting an input digital signal to a baseband signal and an Automatic Gain Control (AGC) for converting the power of the converted baseband signal to a constant value and outputting the same. Here, the DDC generally maintains a high resolution in order to prevent distortion of a signal and a high Signal to Noise Ratio (SNR) characteristic. However, since in reality data required by a modem for signal demodulation has a resolution lower than that of output data of the DDC, a digital signal process system extracts only data corresponding to an effective bit from the output data of the DDC and provides the same to the modem via the AGC. Therefore, the AGC performs a function of controlling the gain of a signal so that the power of an output signal may always maintain a predetermined level regardless of power change of an input signal.

FIG. 1A illustrates a relationship between a data signal output from a DDC and input to an AGC and an effective bit, and FIG. 1B illustrates a relationship between an output data signal of an AGC and an effective bit. Here, assuming that the output effective bit of the AGC is 11 bits, the range of a value that can be represented by the effective bit is 1023 to −1024. As illustrated in FIG. 1A, in the example where the peak power of a data signal input to the AGC is about 1700, since an input signal is a signal not included in the effective bit range, the AGC may control the magnitude of the input signal whose peak power is about 1700 and convert the signal to a signal included in the effective bit range (1023 to −1024) and output the same as illustrated in FIG. 1B.

The conventional AGC uses a method of controlling an output signal using, average power. That is, the conventional AGC calculates average power of an entire input signal and controls the magnitude of an output signal based on the calculated average power. Since this method using the average power has a very long period for calculating and reflecting the average power, when the power of an input signal changes fast instantaneously, it is difficult to recognize the instantaneous power change, so that it is difficult to normally control the magnitude of an output signal.

Also, in the method using the average power, when the power of an input signal drastically changes, the speed of calculating the average power of the power change of the input signal is delayed, so that the signal is lost consequently, and a clipping error may occur.

SUMMARY

To address the above-discussed deficiencies of the prior art, it is a primary object to provide a method and an apparatus for controlling a signal gain in a digital signal process system.

Another aspect of the present disclosure is to provide a method and an apparatus for controlling a signal gain for each period depending on peak power for each period of an input signal in a digital signal process system.

Still another aspect of the present disclosure is to provide a method and an apparatus for numbering an input signal for each period and controlling the magnitude of an input signal based a numbered period number in a digital signal process system.

Yet another aspect of the present disclosure is to provide a method and an apparatus for performing a first step signal gain control based on the average power of an input signal and performing a second step signal gain control based on peak power for each period of an input signal in a digital signal process system.

In accordance with an aspect of the present disclosure, a method for controlling a signal gain in a digital signal process system is provided. The method includes measuring peak power of an input signal for each period, comparing the peak power for each period with threshold power, and controlling a magnitude of a signal of a period where the peak power is greater than the threshold power.

In accordance with another aspect of the present disclosure, an apparatus for controlling a signal gain in a digital signal process system is provided. The apparatus includes a first gain controller for measuring peak power of an input signal for each period, comparing the peak power for each period with threshold power, and controlling a magnitude of a signal of a period where the peak power is greater than the threshold power.

Other aspects, advantages and salient features of the disclosure will become apparent to those skilled in the art from the following detailed description, which, taken in conjunction with the annexed drawings, discloses exemplary embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, like reference numerals will be understood to refer to like parts, components and structures.

DETAILED DESCRIPTION

FIGS. 2 through 8B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device. The following description with reference to the accompanying drawings is provided to assist in a comprehensive understanding of exemplary embodiments of the disclosure as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the disclosure. Also, descriptions of well-known functions and constructions are omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of exemplary embodiments of the present disclosure are provided for illustration purpose only and not for the purpose of limiting the disclosure as defined by the appended claims and their equivalents.

Exemplary embodiments of the present disclosure provide a method and an apparatus for controlling a signal gain in a digital signal process system.

Figure 1A:
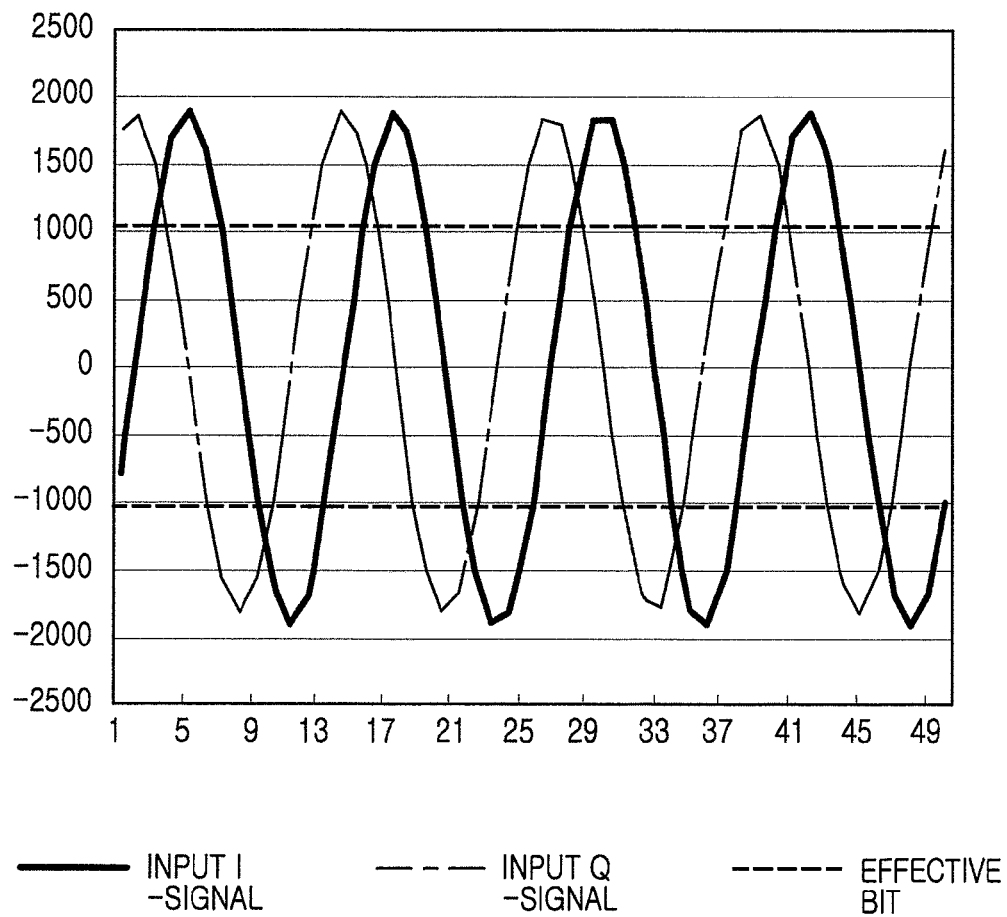
FIG. 1A illustrates a relationship between a data signal output from a DDC and input to an AGC and an effective bit.
Figure 1B:
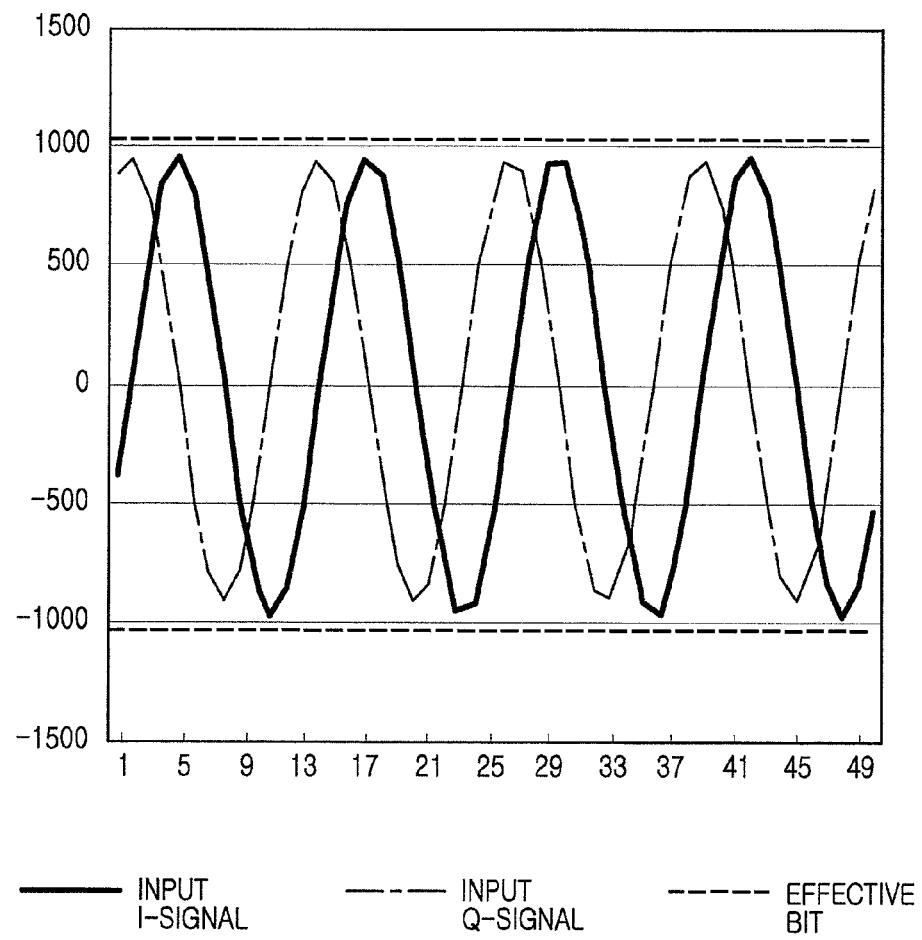
FIG. 1B illustrates a relationship between an output data signal of an AGC and an effective bit.
Figure 2:
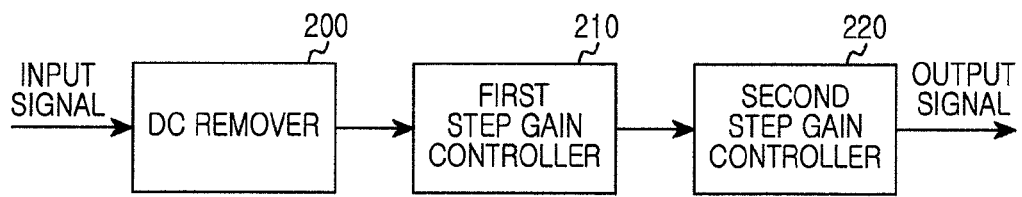
FIG. 2 illustrates a block diagram of an AGC in a digital signal process system according to an embodiment of the present disclosure.

FIG. 2 illustrates a schematic block diagram of an AGC in a digital signal process system according to an embodiment of the present disclosure.

Referring to FIG. 2, the digital signal process system includes a Direct Current (DC) remover 200, a first step gain controller 210, and a second step gain controller 220.

The DC remover 200 removes a DC component of an input digital signal to provide the same to the first step gain controller 210. The DC remover 200 can remove a DC component from an input digital signal using a principle that sum of respective IQ signals input for a predetermined time converges zero. For example, the DC remover 200 can remove a DC component by adding −A when sum of input signals is +A and by adding +A when sum of input signals is −A.

The first step gain controller 210 determines the period of an input signal from the DC remover 200 and allocates a number representing the determined period to respective data forming the input signal depending on the determined period. Also, the first step gain controller 210 may calculate the power of the input signal to measure average power for a predetermined time and compare the measured average power with predetermined threshold power to control and output the magnitude of the input signal or immediately output the input signal without controlling the magnitude of the input signal depending on the comparison result. Here, the average power denotes the average power of a signal input for a predetermined time section, not the average power of an entire signal input up to now. The predetermined time section for calculating the average power may be set by experiment. Also, the predetermined threshold power denotes power corresponding to an output effective bit of the AGC. For example, in the example where the output effective bit of the AGC is n bits, the threshold power may be $1023$ ($2^n-1$).

When the average power is greater than the threshold power, the first step gain controller 210 controls the magnitude of a signal input during a section where the average power maintains a value greater than the threshold power. At this point, the first step gain controller 210 determines a scale value (or magnitude control value) for an input signal depending on the magnitude of the average power, and controls the magnitude of the input signal to the determined scale value. In contrast, when the average power is equal to or less than the threshold power, the first step gain controller 210 immediately outputs a signal input during a section where the average power maintains a value equal to or less than the threshold power without changing the magnitude. Here, the first step gain controller 210 may determine whether relevant data is a signal input during a section where the average power maintains a value greater than the threshold power or a signal input during a section where the average power maintains a value equal to or less than the threshold power based on a period number allocated to respective data forming the input signal.

The second step gain controller 220 performs a function for fine-controlling a signal that has not been controlled as a signal within the effective bit range so that the signal may be included within the effective bit range. That is, the second step gain controller 220 may determine peak power for each period of an output signal of the first step gain controller 210 and compare the peak power for each period with predetermined threshold power to control and output the magnitude of an input signal or immediately output the signal without controlling the magnitude of the input signal depending on the comparison result. At this point, the second step gain controller 220 may determine the peak power for each period based on the period determined by the first step gain controller 210 and an allocated period number. Here, the threshold power is the same as the threshold power used by the first step gain controller 210. That is, the threshold power used by the second step gain controller 220 denotes power corresponding to an output effective bit of the AGC.

When the peak power of a specific period is greater than the threshold power, the second step gain controller 220 controls the magnitude of an input signal corresponding to the relevant period. At this point, the second step gain controller 220 determines a scale value of an input signal of the relevant period depending on the magnitude of the peak power and controls the magnitude of the input signal corresponding to the relevant period to the determined scale value. In contrast, when the peak power of the specific period is equal to or less than the threshold power, the second step gain controller 220 immediately outputs the input signal without controlling the magnitude of the input signal corresponding to the relevant period. Here, the second step gain controller 220 can determine whether relevant data is an input signal corresponding to a period where the peak power is greater than the threshold power or an input signal corresponding to a period where the peak power is equal to or less than the threshold power based on a period number allocated to respective data forming the input signal.

The first step gain controller 210 and the second step gain controller 220 illustrated in FIG. 2 are described in detail with reference to FIGS. 3 to 5.

Figure 3:
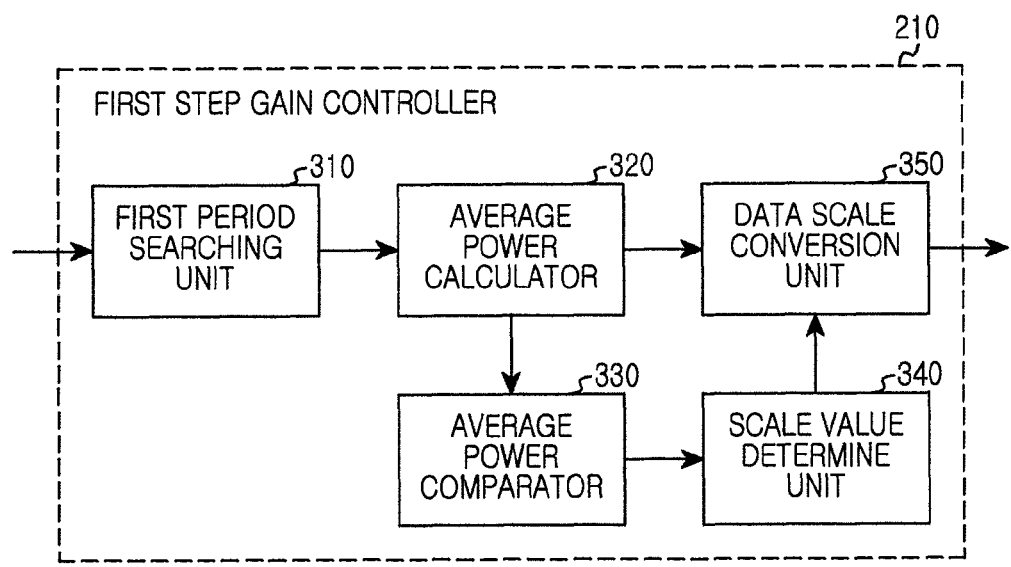
FIG. 3 illustrates a detailed block diagram of a first step gain controller forming an AGC according to an embodiment of the present disclosure.
Figure 4:
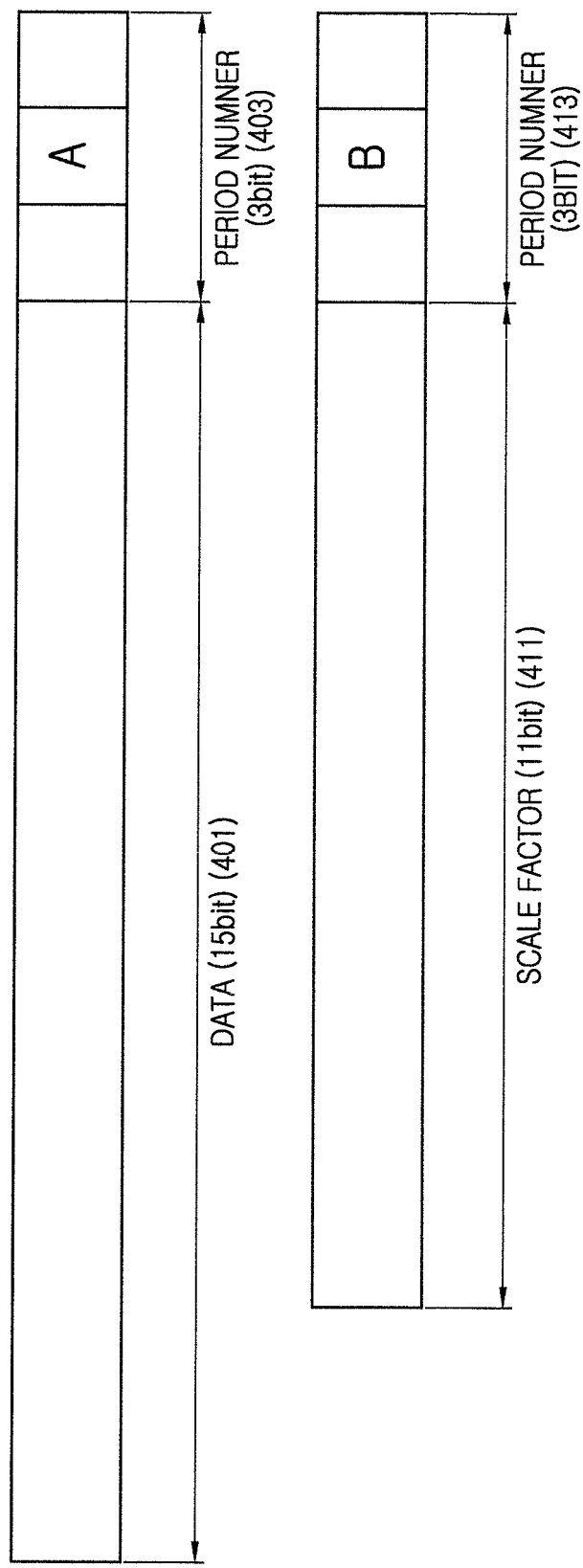
FIG. 4 illustrates numbering depending on the period of an input signal at an AGC according to an embodiment of the present disclosure.

FIG. 3 illustrates a detailed block diagram of a first step gain controller forming an AGC according to an embodiment of the present disclosure.

Referring to FIG. 3, the first step gain controller 210 may include a first period searching unit 310, an average power calculator 320, an average power comparator 330, a scale value determine unit 340, and a data scale conversion unit 350.

The first period searching unit 310 receives an output signal from the DC remover 200 and determines a period based on the power of the input signal. At this point, the first period searching unit 310 determines the period based on a point where the power of the input signal changes from (−) power to (+) power or a point where the power of the input signal changes from (+) power to (−) power. Specifically, when data 'a' having (−) power is input to the first period searching unit 310 and then data 'b' having (+) power is immediately input, the first period searching unit 310 may determine the data 'b' as the beginning of an n-th period. Also, the first period searching unit 310 calculates the power of signal data input after the data and when detecting that data 'd' having (+) power is input right after data 'c' having (−) power is input, the first period searching unit 310 may determine the data 'c' as the ending of the n-th period and determine the data 'd' as the beginning of an (n+1)-th period. For example, in the example where the power of signal data input to the first period searching unit 310 are ". . . , −20, −10, 10, 20, 30, 20, 10, −10, −20, −30, −20, −10, 10, 20, . . . ", the first period searching unit 310 may determine the data having the power of the first ". . . , −20, −10" as an (n−1)-th period, determine data having the power of the next "10, 20, 30, 20, 10, −10, −20, −30, −20, −10" as an n-th period, and determine data having the power of the next "10, 20, . . . " as an (n+1)-period.

Also, after determining the period of respective data, the first period searching unit 310 allocates period numbers to respective data forming an input signal. At this point, the period number may be allocated by adding a predetermined number of bits to a bit of each data. For example, as illustrated in FIG. 4, the first period searching unit 310 may add a period number A, 403 consisting of lower 3 bits to 15-bit data 401. Here, the first period searching unit 310 allocates the period number to the lower bits because when the period number is allocated to the upper bits, the magnitude characteristic of data may be influenced. For example, the first step gain controller 210 may allocate a period number 1 denoting a first period to respective data forming an input signal of the first period and allocate a period number 2 denoting a second period to respective data forming an input signal of the second period. That is, the first period searching unit 310 may allocate the same period number to all of data forming an input signal of a specific period. In addition, with respect to an In-phase component (I component) and a Quadrature-phase component (Q component) forming an input signal, the first period searching unit 310 may allocate the same period number based on one of the components. However, in case of separately signal-processing I and Q signals, the first period searching unit 310 does not need to allocate the same period number but allocates a unique period number depending on each period. A designer of an AGC may selectively apply the above period number allocate method depending on the characteristic of a system. Here, the first period searching, unit 310 allocates a period number depending on the period of an input signal to allow the first step gain controller 210 and the second step gain controller 220 to determine only a signal of a period meeting a relevant condition and control the magnitude of the signal.

The average power calculator 320 calculates average power of an input signal for a predetermined time, provides the calculated average power to the average power comparator 330, and provides the input signal to the data scale conversion unit 350. Here, the average power denotes the average power of a signal input for a predetermined time section, not the average power of an entire signal input up to now. That is, the average power denotes the average power of a signal input during a previous predetermined time section starting from a current point. The average power may be updated on a period basis of an input signal. For example, the average power calculator 320 may calculate average power over a signal of an (n-t)-th period to a signal of an n-th period at a point where the signal of the n-th period is input, and calculate average power over a signal of an (n-t+1)-th period to a signal of an (n+1)-th period at a point where the signal of the (n+1)-th period is input. At this point, the predetermined time section for calculating the average power may be set by experiment, and when the predetermined time section is set short, the average power calculator 320 can flexibly deal with a drastic power change of an input signal. At this point, since the power of the input signal consists of (−) power and (+) power, the average power calculator 320 can obtain an absolute values of respective power of the input signal and then calculate the average power using the obtained absolute values.

The average power comparator 330 compares the average power calculated by the average power calculator 320 with predetermined threshold power to determine whether magnitude control of an input signal is needed. When the average power is greater than the threshold power, the average power comparator 330 determines to control the magnitude of an input signal input during a section where the average power maintains a value greater than the threshold power, and provides scale information that depends on the determination result to the scale value determine unit 340. In contrast, when the average power is equal to or less than the threshold power, the average power comparator 330 determines to immediately output an input signal input during a section where the average power maintains a value equal to or less than the threshold power without changing the magnitude of the input signal, and provides the determination result to the scale value determine unit 340. Here, the scale information may include information representing whether to control the magnitude, a period number of an input signal corresponding to a section where the magnitude is to be controlled or a section where the magnitude is not to be controlled, and average power information. Here, the threshold power denotes power corresponding to an output effective bit of the AGC. For example, in the example where the output effective bit of the AGC is n bits, the threshold power may be 1023 ($2^n-1$).

When the scale information is provided from the average power comparator 330, the scale value determine unit 340 determines a scale value depending on the scale information and provides the determined scale value to the data scale conversion unit 350. At this point, the scale value determine unit 340 retrieves a scale value corresponding to the average power provided from the average power comparator 330 from a table representing a scale value for each average power stored in advance, and allocates a period number to the retrieved scale value. At this point, the period number denotes a period number included in the scale information, and may be allocated by adding a predetermined number of bits to a bit representing a scale value. Here, the scale value may be a constant value that can control the entire power level of an input signal. For example, as illustrated in FIG. 4, the scale value determine unit 340 may add a period number B, 413 consisting of 3 bits to a 11-bit scale value 411. Here, the scale value determine unit 340 may represent the position of a signal to which a scale value is to be applied by adding the period number to the scale value. Also, when scale information representing that magnitude control of an input signal of a specific period is not performed is input from the average power comparator 330, the scale value determine unit 340 may determine a basic scale value set in advance regardless of average power. At this point, the basic scale value set in advance may be a value that does not change a signal magnitude of a relevant period even when the value is applied to the signal of the relevant period.

The data scale conversion unit 350 controls the magnitude of an input signal by applying a scale value provided from the scale value determine unit 340 to the input signal provided from the average power calculator 320. At this point, the data scale conversion unit 350 determines a period number allocated to a scale value, and then multiplies each data having the same period number as the scale value among input signals provided from the average power calculator 320 by a scale value. Here, only the magnitude of the input signal to which the scale value has been applied is controlled with the phase maintained. In addition, the data scale conversion unit 350 multiplies an input signal by a scale value, and then may change the number of bits increased by the multiplication operation to the number of original bits. For example, in the example where a scale value consists of n bits, the data scale conversion unit 350 divides data to which the scale value has been applied by a value of n bits again so that the data may have the number of same bits as the original data consequently.

The data scale conversion unit 350 outputs a signal whose magnitude has been controlled by a scale value to the second step gain controller 220.

Figure 5:
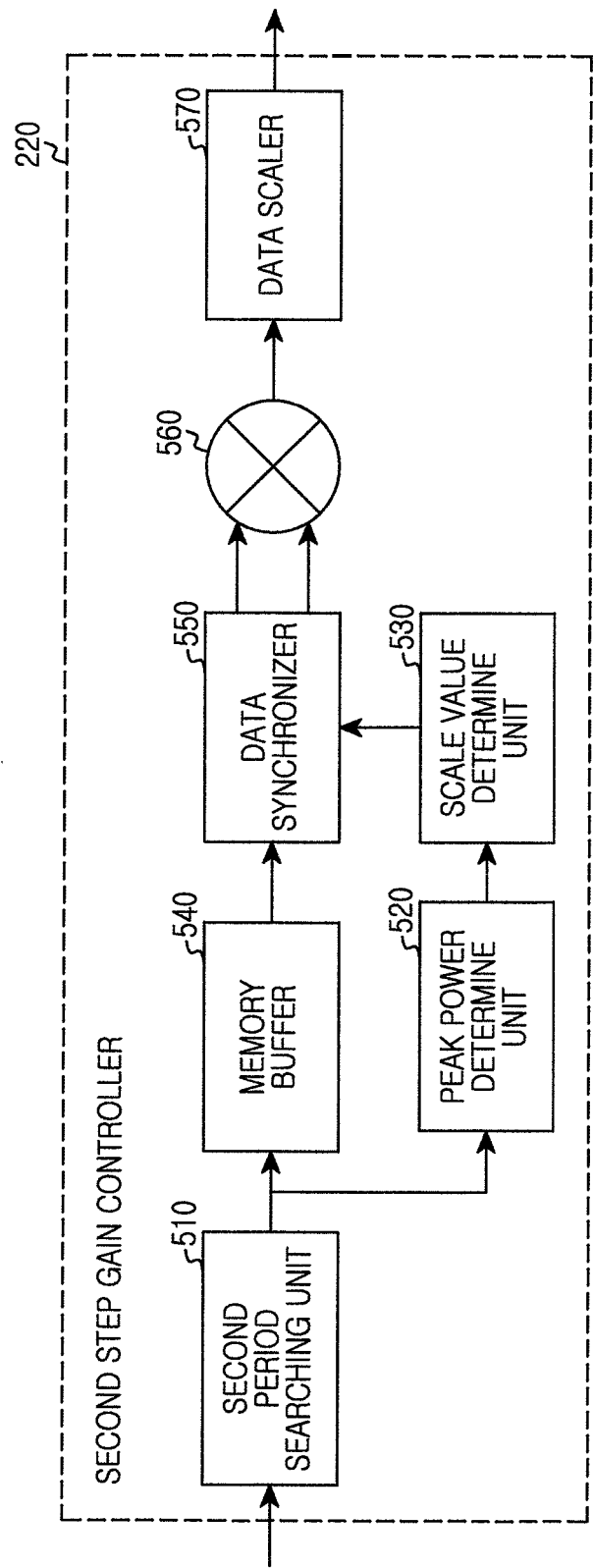
FIG. 5 illustrates a detailed block diagram of a second step gain controller forming an AGC according to an embodiment of the present disclosure.

FIG. 5 illustrates a detailed block diagram of a second step gain controller forming an AGC according to an embodiment of the present disclosure.

Referring to FIG. 5, the second step gain controller 220 includes a second period searching unit 510, a peak power determine unit 520, a scale value determine unit 530, a memory buffer 540, a data synchronizer 550, a multiplier 560, and a data scaler 570.

The second period searching unit 510 determines the period of a signal provided from the first step gain controller 210. This is a process for determining the range of a period signal for determining peak power for each period. At this point, since the signal provided from the first step gain controller 210 is already allocated a period by the first step gain controller 210 depending on the period of the signal, the second period searching unit 510 does not perform a separate period number allocate operation. Here, in the example where the second period searching unit 510 performs period determination and period number allocation of an input signal, a situation where a relevant period signal passes through the second step gain controller 220 before the second period searching unit 510 determines the period of the input signal and allocates a period number to a signal of each period, so that a scale value depending on peak power cannot be applied, may occur. Therefore, to prevent this situation, in an embodiment of the present disclosure, the first period searching unit 310 of FIG. 3 performs period determination and period number allocation of an input signal.

The peak power determine unit 520 calculates the peak power of a signal for each period depending on the period of a signal determined by the second period searching unit 510. That is, the peak power determine unit 520 determines the power of respective signal data having the same period number and determines a highest power value to determine the same as peak power. The peak power determine unit 520 provides the peak power of a signal for each period to the scale value determine unit 530.

The scale value determine unit 530 receives the peak power of a signal for each period from the peak power determine unit 520 and compares the peak power of the signal for each period with threshold power to determine whether magnitude control of a signal of each period is needed. That is, when the peak power of a specific period is greater than the threshold power as a result of comparison of the peak power of the specific period with the threshold power, the scale value determine unit 530 determines magnitude control of a signal for the specific period is needed. When the peak power of the specific period is equal to or less than the threshold power, the scale value determine unit 530 determines magnitude control of the signal for the specific period is not needed. After that, the scale value determine unit 530 determines a scale value for a signal of a period needing magnitude control. At this point, the scale value determine unit 530 may determine a scale value with reference to a table representing a scale value for each peak power stored in advance, and determine a scale value using a function determining a scale value depending on peak power. Here, the scale value may be a constant value that can control the power level of a signal of a relevant period.

Also, with respect to a signal of a period where peak power is equal to or less than the threshold power, the scale value determine unit 340 may determine a magnitude control of the signal is not needed and determine to apply a predetermined basic scale value regardless of peak power. At this point, the predetermined basic scale value may be a value that does not change the signal magnitude of a relevant period even when the value is applied to the signal of the relevant period.

When a scale value for a period where peak power exceeds the threshold power is determined, the scale value determine unit 530 may allocate a period number representing a relevant period to the determined scale value. For example, as illustrated in FIG. 4, the scale value determine unit 530 may add a 3-bit period number B, 413 to a 11-bit scale value 411. Here, the scale value determine unit 530 may represent the position of a signal to which a scale value is to be applied by adding a period number to the scale value.

The memory buffer 540 temporarily stores data corresponding to each period output from the second period searching unit 510 while the peak determine unit 520 and the scale determine unit 530 determine a scale value corresponding to each period. That is, when a signal of a specific period is input from the second period searching unit 510, the memory buffer 540 temporarily stores a signal of a specific period until the scale determine unit 530 determines a scale value for a specific period.

The data synchronizer 550 performs a function of synchronizing data of an input signal for each period with a scale value corresponding to each period of the input signal. That is, the data synchronizer 550 synchronizes data of an input signal for each period with a scale value corresponding to each period of the input signal so that data having the same period number is multiplied by the scale value at the multiplier 560. At this point, the data synchronizer 550 performs synchronization on a plurality of data having the same period number so that the data are multiplied by a scale value having the same period number.

The multiplier 560 multiplies data having the same period number output from the data synchronizer 550 by a scale value to provide the same to the data scale controller 570.

The data scale controller 570 performs a function for changing the number of bits increased by a multiplication operation of the multiplier 560 to the number of original bits. For example, in the example where a scale value consists of n bits, the data scale controller 570 divides a result multiplied by a scale value by an n-bit value, so that final resultant data may have the same number of bits as the number of bits of the original data.

Though the exemplary embodiments where the first period searching unit 310 and the second period searching unit 510 are included in the first step gain controller 210 and the second step gain controller 220, respectively, has been described in FIGS. 3 and 5, the first period searching unit 310 and the second period searching unit 510 may be configured outside the first step gain controller 210 and the second step gain controller 220 separately.

Though all signals pass through the multiplier and even a signal that does not need scale change is multiplied by the basic scale so that the scale may not change in FIGS. 3 and 5, a signal that does not need scale change is allowed to bypass the multiplier so that the scale value may not be applied depending on a design scheme.

Figure 6:
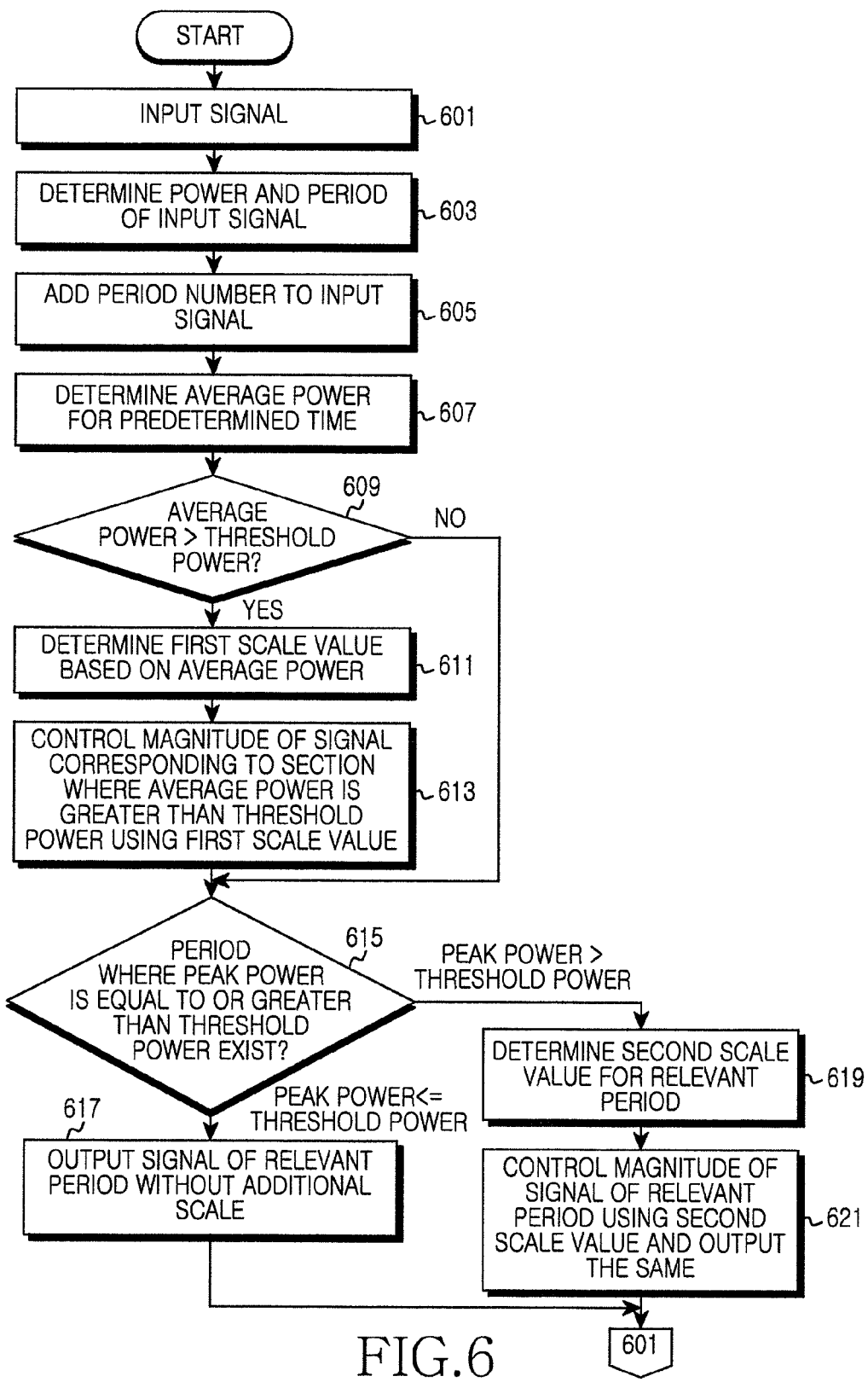
FIG. 6 illustrates a flowchart of a procedure for controlling a signal gain at an AGC according to an embodiment of the present disclosure.

FIG. 6 illustrates a flowchart of a procedure for controlling a signal gain at an AGC according to an embodiment of the present disclosure.

Referring to FIG. 6, the AGC receives an output signal from a DDC (not shown) or a modem in step 601. At this point, the AGC may remove a DC component of the input signal.

After that, the AGC determines the power and the period of the input signal in step 603. That is, the AGC measures the power of respective data forming the input signal and determines the period of the input signal based on the measured power. Here, the AGC determines the period based on a point where the power of the input signal changes from (−) power to (+) power or a point where the power of the input signal changes from (+) power to (−) power. Specifically, when data 'a' having (−) power is input and then data 'b' having (+) power is immediately input, the AGC may determine the data 'b' as the beginning of an n-th period. Also, the AGC calculates power of signal data input after the data 'b', and when detecting that data 'd' having (+) power is input right after data 'c' having (−) power is input, AGC may determine the data 'c' as the ending of the n-th period and determine the data 'd' as the beginning of an (n+1)-th period.

After that, the AGC proceeds to step 605 to add a period number to respective data forming the input signal depending on the determined period. That is, as illustrated in FIG. 4, the AGC may add a period number A, 403 consisting of 3 bits to a 15-bit data 401. For example, the AGC may allocate a period number 1 denoting a first period to a plurality of respective data forming an input signal of the first period and allocate a period number 2 denoting a second period to a plurality of respective data forming an input signal of the second period. That is, the AGC allocates the same period number to all of data forming an input signal of a specific period, and also allocates the same period number based on one of components with respect to an I component and a Q component forming an input signal. Here, the AGC allocates a period number depending on the period of an input signal in order to determine only a signal of a period meeting a condition according to an embodiment of the present disclosure and control the magnitude of the signal.

After that, the AGC proceeds to step 607 to determine the average power of an input signal input for a predetermined period, and compares the average power with the threshold power to determine whether the average power has a value greater than the threshold power in step 609. When the average power is equal to or less than the threshold power, the AGC immediately proceeds to step 615.

In contrast, when the average power is greater than the threshold power, the AGC determines a first scale value based on the average power in step 611. Here, the AGC may determine a scale value based on a table representing a scale value for each average power stored in advance, and allocates a period number to the scale value in order to represent the position of a signal to which the determined scale value is to be applied as illustrated in FIG. 4. At this point, the period number may be the period number of an input signal corresponding to a section where the average power is greater than the threshold power.

After that, the AGC controls the magnitude of an input signal corresponding to a section where the average power is greater than the threshold power using the first scale value in step 613. That is, the AGC multiplies the input signal corresponding to the section where the average power is greater than the threshold power by the first scale value to control only the magnitude of the signal with the phase of the relevant input signal maintained. At this point, the AGC may determine whether the input signal is a signal corresponding to the section where the average power is greater than the threshold power using a period number allocated to respective data forming the input signal.

After that, the AGC proceeds to step 615 to determine whether peak power for each period has a value greater than the threshold power. With respect to a period where the peak power has the value equal to or less than the threshold power, the AGC proceeds to step 617 to output a signal of the relevant period without additional scale, that is, without additional control of the magnitude of the signal.

In contrast, with respect to a period where the peak power has a value greater than the threshold power, the AGC proceeds to step 619 determine a second scale value for the relevant period and proceeds to step 621 to control the signal magnitude of the relevant period to the second scale value and output the same. Here, the AGC may determine the scale value based on a table representing a scale value for each power stored in advance or a function for a scale value for each power. Also, in order to represent the position of a signal to which the determined scale value is to be applied, the AGC allocates a period number to a scale value as illustrated in FIG. 4. At this point, the period number may be a period number of a period where the peak power is greater than the threshold power. Also, the AGC multiplies a signal of the period where the peak power is greater than the threshold power by the second scale value to control only the magnitude of the input signal with the phase of the relevant input signal maintained. At this point, the AGC may determine data corresponding to a period to which the second scale value is to be applied based on the period number allocated to the second scale value.

After that, the AGC returns to step 601 to re-perform subsequent steps.

Figure 7:
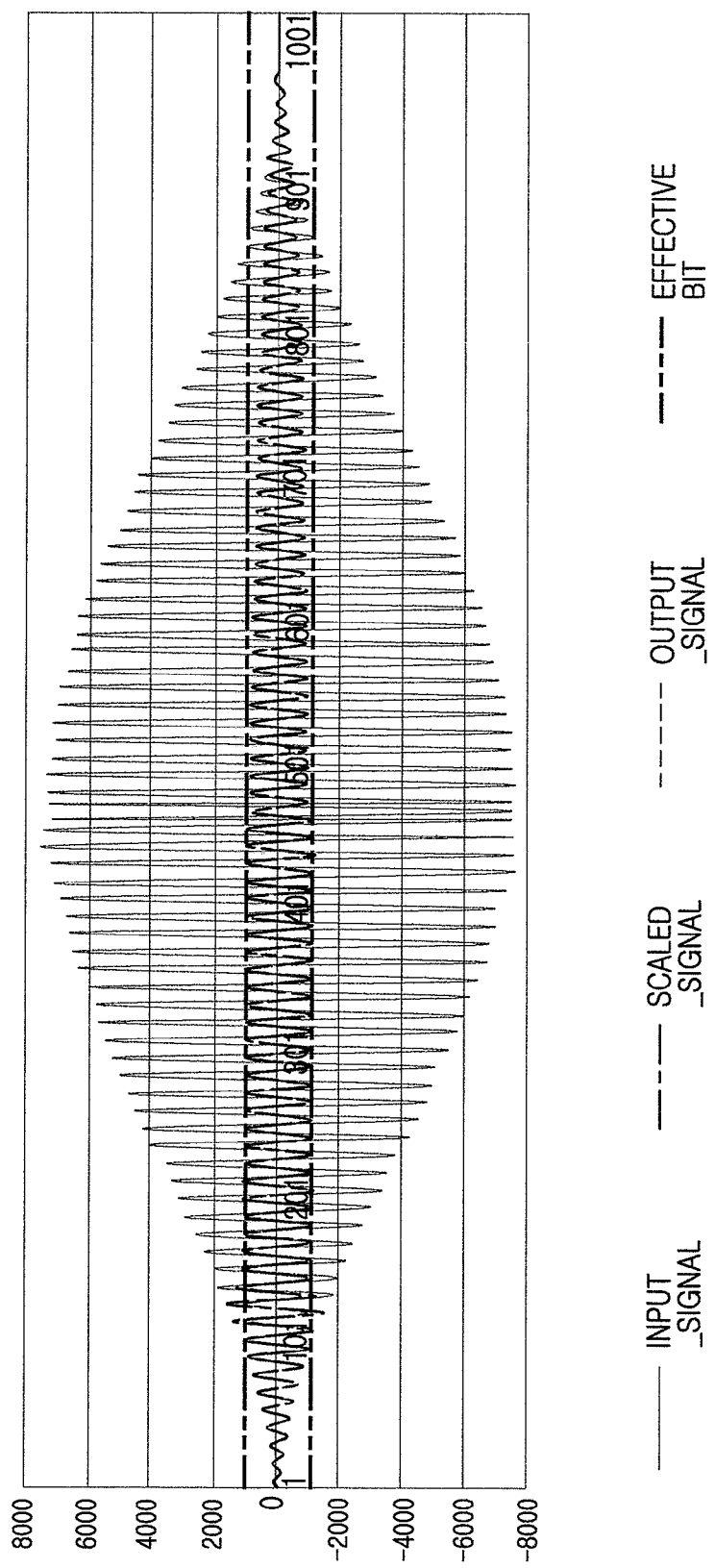
FIG. 7 illustrates a graph of results of controlling a signal gain of an AGC according to an embodiment of the present disclosure.

FIG. 7 illustrates a graph of results of controlling, a signal gain of an AGC according to an embodiment of the present disclosure. FIG. 7 illustrates a relation between an input signal and an output signal in the example where an AGC according to the present disclosure calculates power using only an I component of an input signal. As illustrated in FIG. 7, the AGC according to the present disclosure may change an input signal so that the input signal may be included within the range of an effective bit and output the same even when the power of an input signal drastically increases.

Figure 8A:
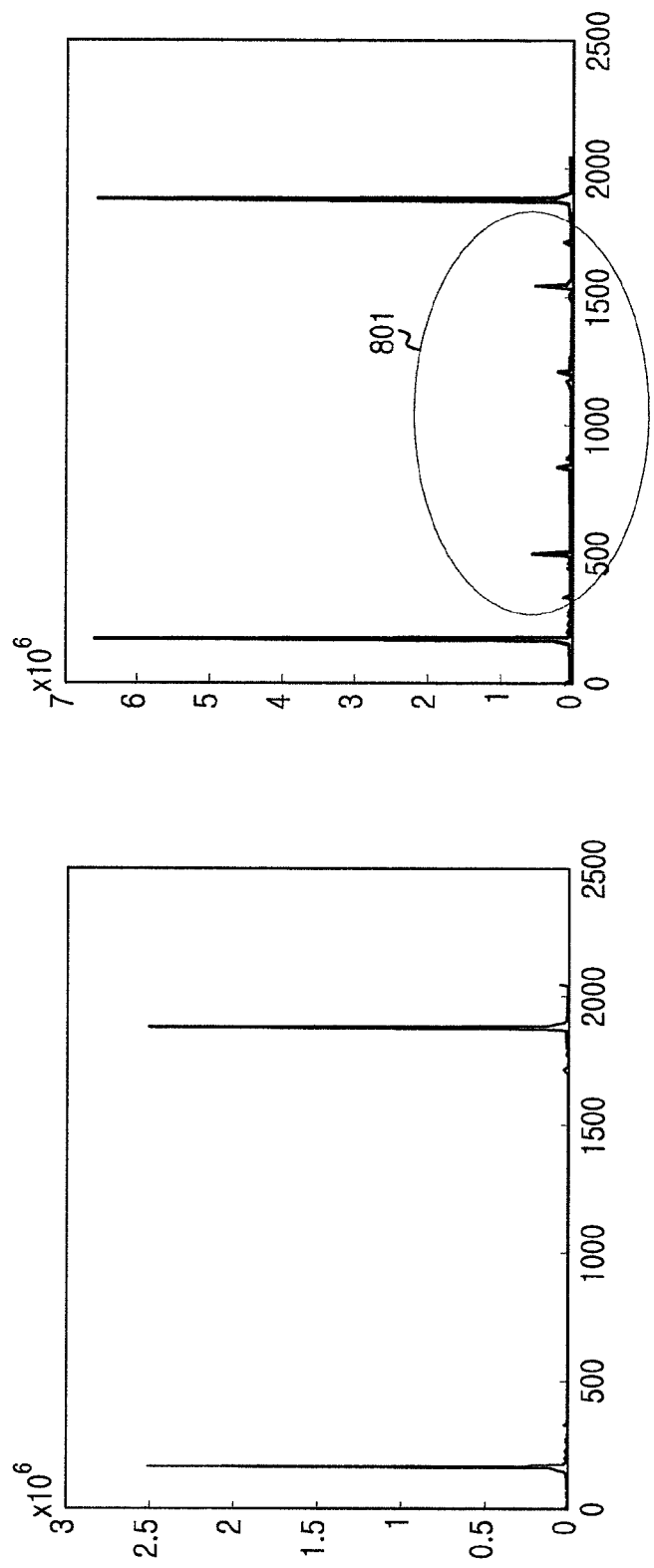
FIGS. 8A and 8B illustrate graphs of input and output signals of an AGC according to the conventional art and the present disclosure.
Figure 8B:
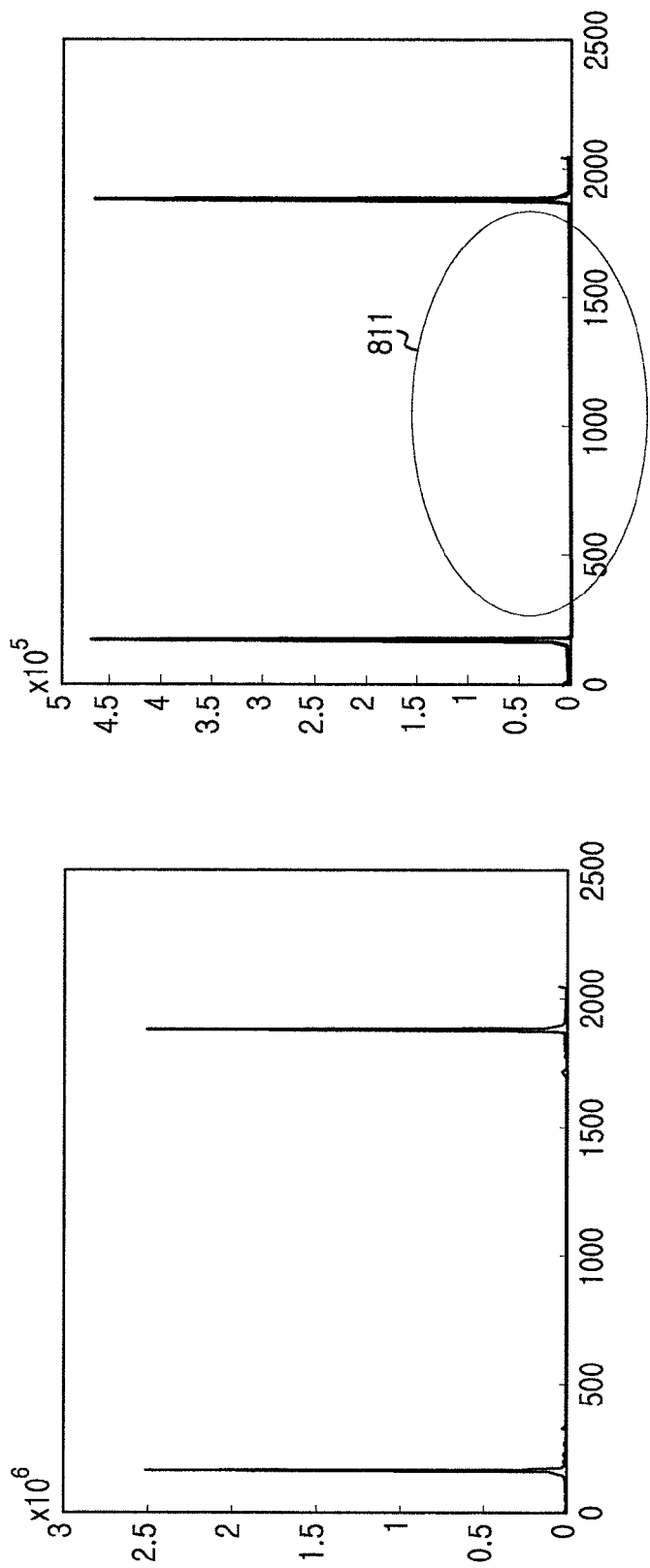

FIGS. 8A and 8B illustrate graphs of input and output signals of an AGC according to the conventional art and the present disclosure.

FIG. 8A illustrates an input signal and an output signal of the conventional AGC in a frequency domain, and FIG. 8B illustrates an input signal and an output signal of an AGC according to the present disclosure in a frequency domain.

As illustrated in FIG. 8A, in the conventional AGC, a noise component that has not existed in an input signal is generated to an output signal. In contrast, as illustrated in FIG. 8B, the AGC according to the present disclosure outputs the same signal as an input signal without signal distortion.

For convenience in description, the present disclosure has described a method for, when average power or peak power is greater than threshold power, controlling the magnitude of a signal of a relevant period small so that the signal magnitude of the relevant period may be included within power expressible in terms of an effective bit. However, according to an embodiment of the present disclosure, the present disclosure is applicable to a method for setting two threshold power having different values, and when average power or peak power is less than the threshold power by a predetermined numerical value, controlling the signal magnitude of the relevant period large within a range where the signal magnitude of the relevant period is included within power expressible in terms of an effective bit.

According to an embodiment of the present disclosure, a digital signal process system may change the power of an input signal to a signal within an effective bit regardless of a power change of the input signal and output the same by performing a first step signal gain control based on the average power of the input signal and performing a second step signal gain control based on peak power of the input signal for each period, so that a stable signal characteristic can be obtained. Also, instability of an output signal by introduction of an unstable signal can be prevented in advance, so that an amplifier or a Radio Frequency (RF) amply circuit can be safely protected.

Although the disclosure has been shown and described with reference to certain exemplary embodiments thereof, it will be understood by those skilled in the art that various changes in form and details may be made therein without departing from the spirit and scope of the disclosure as defined by the appended claims and their equivalents. Therefore, the scope of the present disclosure should not be limited to the above-described embodiments but should be determined by not only the appended claims but also the equivalents thereof.

What is claimed is:

1. A method for controlling a signal gain in a digital signal process system, the method comprising:
   measuring a power of respective data forming an input signal;
   determining a period of the respective data forming the input signal based on the measured power;
   allocating a period number to each of the data forming the input signal based on the determined period by adding at least one bit representing the allocated period number to each of the data forming the input signal;
   measuring a peak power of the input signal for each of a plurality of periods based on the allocated period number;
   comparing the peak power for each period with a threshold power; and
   controlling a magnitude of each of the data forming a signal of a period where the peak power is greater than the threshold power.

2. The method of claim 1, wherein measuring the peak power of the input signal for each of the periods comprises determining a maximum power among power for data to which a same period number has been allocated as the peak power.

3. The method of claim 2, further comprising:
   before measuring the peak power of the input signal for each of the periods, measuring an average power of the input signal;
   comparing the average power with the threshold power; and
   when the average power is greater than the threshold power, controlling a magnitude of the input signal, and when the average power is equal to or less than the threshold power, not controlling the magnitude of the input signal.

4. The method of claim 2, wherein controlling the magnitude of each of the data forming the signal of the period where the peak power is greater than the threshold power comprises:
   determining a scale value depending on the peak power;
   allocating a period number of the period where the peak power is greater than the threshold power to the scale value; and
   multiplying data by the scale value having a same period number to control a power for the data such that the data are included within a range of an effective bit.

5. The method of claim 4, wherein allocating the period number of the period where the peak power is greater than the threshold power to the scale value comprises:
   determining the period number of the period where the peak power is greater than the threshold power; and
   adding at least one bit representing the determined period number to the scale value.

6. The method of claim 4, wherein multiplying the data by the scale value having the same period number to control the power for the data such that the data are included within the range of the effective bit comprises:
   dividing the multiplied data by a value including a same bit as the scale value.

7. The method of claim 2, wherein determining the period of the input signal based on the measured power comprises:

determining the period based on one of a point where the measured power changes from (−) power to (+) power and a point where the measured power changes from (+) power to (−) power.

8. The method of claim 2, wherein allocating the period number to each of the data forming the input signal comprises:

allocating a same period number based on one of an In-phase component (I component) and a Quadrature-phase component (Q component) forming the input signal.

9. The method of claim 1, further comprising:

outputting a signal of a period where the peak power is equal to or less than the threshold power without magnitude control.

10. The method of claim 1, further comprising:

before measuring the peak power of the input signal, estimating a Direct Current (DC) portion of the input signal; and removing the estimated DC portion.

11. An electronic device for controlling a signal gain, the device comprising:

a period searching unit configured to measure a power of respective data forming an input signal, determine a period of the respective data forming the input signal based on the measured power, and allocate a period number to each of the data forming the input signal based on the determined period by adding at least one bit representing the allocated period number to each of the data forming the input signal; and a first gain controller configured to measure a peak power of the input signal for each of a plurality of periods based on the allocated period number, compare the peak power for each period with a threshold power, and control a magnitude of each of the data forming a signal of a period where the peak power is greater than the threshold power.

12. The device of claim 11, wherein the first gain controller is configured to determine a maximum power among power for data to which a same period number has been allocated as the peak power.

13. The device of claim 12, further comprising:

a second gain controller configured to, before measuring the peak power of the input signal for each of the periods at the first gain controller, measure average power of the input signal, compare the average power with the threshold power, when the average power is greater than the threshold power, control a magnitude of the input signal, and when the average power is equal to or less than the threshold power, not control the magnitude of the input signal.

14. The device of claim 11, wherein the first gain controller is configured to determine a scale value depending on the peak power, allocate a period number of the period where the peak power is greater than the threshold power to the scale value, and multiply data by the scale value having a same period number to control a power for the data such that the data are included within a range of an effective bit.

15. The device of claim 12, wherein the first gain controller is configured to determine a period number of the period where the peak power is greater than the threshold power, and add at least one bit representing the determined period number to the scale value to allocate the period to the scale value.

16. The device of claim 14, wherein the first gain controller is configured to divide the multiplied data by a value including a same bit as the scale value.

17. The device of claim 12, wherein the period searching unit is configured to determine the period based on one of a point where the measured power changes from (−) power to (+) power and a point where the measured power changes from (+) power to (−) power.

18. The device of claim 12, wherein the period searching unit is configured to allocate a same period number based on one of an In-phase component (I component) and a Quadrature-phase component (Q component) forming the input signal.

19. The device of claim 11, wherein the first gain controller is configured to output a signal of a period where the peak power is equal to or less than the threshold power without magnitude control.

20. The device of claim 11, further comprising a Direct Current (DC) remover configured to, before measuring the peak power of the input signal, estimate a Direct Current (DC) portion of the input signal, and remove the estimated DC portion.

* * * * *